United States Patent
Cheng

(10) Patent No.: US 10,297,517 B2
(45) Date of Patent: May 21, 2019

(54) MANUFACTURING METHOD OF PACKAGE CARRIER

(71) Applicant: Subtron Technology Co., Ltd., Hsinchu County (TW)

(72) Inventor: Chih-Hsien Cheng, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 8 days.

(21) Appl. No.: 15/723,206

(22) Filed: Oct. 3, 2017

(65) Prior Publication Data

US 2018/0025956 A1 Jan. 25, 2018

Related U.S. Application Data

(62) Division of application No. 14/932,974, filed on Nov. 5, 2015, now abandoned.

(51) Int. Cl.
*H01L 23/13* (2006.01)
*H01L 23/367* (2006.01)
(Continued)

(52) U.S. Cl.
CPC .......... *H01L 23/13* (2013.01); *H01L 23/3677* (2013.01); *H01L 23/49822* (2013.01); *H05K 1/0204* (2013.01); *H05K 3/427* (2013.01); *H01L 2224/48091* (2013.01); *H01L 2224/48227* (2013.01); *H01L 2224/73265* (2013.01);
(Continued)

(58) Field of Classification Search
CPC .. H05K 1/0201; H05K 1/0203; H05K 3/4602; H05K 3/4611; H05K 2201/06; H05K 2201/10227; H05K 1/0204; H05K 3/022; H05K 3/427; H05K 2201/10416; H05K 2203/0191; H01L 23/13; H01L 23/3677; H01L 23/49822; H01L 2224/48091; H01L 2224/48227; H01L 2224/73265; H01L 2924/00014
See application file for complete search history.

(56) References Cited

U.S. PATENT DOCUMENTS 4,802,532 A * 2/1989 Dawes ................ H01L 23/4006
165/185
5,617,294 A * 4/1997 Watson ............... H01L 21/4882
174/16.3
(Continued)

*Primary Examiner* — Carl J Arbes
(74) *Attorney, Agent, or Firm* — JCIPRNET

(57) ABSTRACT

A manufacturing method of a package carrier is provided. A substrate having a through hole is provided, wherein a profile of the through hole from top view is a first rounded rectangular. A heat conducting slug is disposed inside the through hole, wherein the heat conducting slug and an inner wall of the through hole are separated with a gap, and a profile of the heat conducting slug from top view is a second rounded rectangular. An insulating material is filled in the through hole so as to fix the heat conducting slug in the through hole. A conductive through hole structure, a first and a second patterned circuit layers are formed. The first and the second patterned circuit layers are respectively formed on two opposite sides of the substrate. The conductive through hole structure penetrates the substrate and connects portions of the first and the second patterned circuit layers.

6 Claims, 9 Drawing Sheets

(51) Int. Cl.
*H01L 23/498* (2006.01)
*H05K 1/02* (2006.01)
*H05K 3/42* (2006.01)
*H05K 3/02* (2006.01)

(52) U.S. Cl.
CPC ... *H05K 3/022* (2013.01); *H05K 2201/10416* (2013.01); *H05K 2203/0191* (2013.01)

(56) References Cited

U.S. PATENT DOCUMENTS

| | | | |
|---|---|---|---|
| 8,847,356 B2* | 9/2014 | Saita | H05K 1/186 257/532 |
| 2012/0279760 A1* | 11/2012 | Sun | H01L 33/642 174/252 |
| 2014/0144677 A1* | 5/2014 | Wang | H05K 1/0206 174/252 |

* cited by examiner

MANUFACTURING METHOD OF PACKAGE CARRIER

CROSS-REFERENCE TO RELATED APPLICATION

This application is a divisional application of and claims the priority benefit of U.S. application Ser. No. 14/932,974, filed on Nov. 5, 2015, now pending, which claims the priority benefit of Taiwan application serial no. 104130925, filed on Sep. 18, 2015. The entirety of each of the above-mentioned patent applications is hereby incorporated by reference herein and made a part of specification.

BACKGROUND OF THE INVENTION

Field of the Invention

The present invention relates to a package structure and a method for manufacturing the same, and particularly relates to a package carrier and a method for manufacturing the same.

Description of Related Art

In general, the heat conducting slug is embedded inside the package carrier in order to effectively enhance the heat conducting effect of the package carrier. Herein, the hole used to embed the heat conducting slug of the package carrier is manufactured by mechanical routing process or laser routing process, and therefore the profile of the hole from top view is easily formed as a rounded rectangular. The heat conducting slug is manufactured by etching process and laser cutting process, and therefore the profile of the heat conducting slug from top view is a right angle rectangular. Hence, stress is concentrated at the sharp corner of the heat conducting slug or the sharp corner of the heat conducting slug leans against the rounded corner of the hole so that the heat conducting slug cannot be positioned inside the hole. Furthermore, the production process of the heat conducting slug is also long because of etching process, and simultaneously the disadvantage that the cutting quality is inconsistent is generated because of laser cutting process. In addition, when the heat conducting slug is embedded inside the package carrier, in order to prevent the hole used to embed the heat conducting slug of the package carrier from interfering with the heat conducting slug, the gap between the hole and the heat conducting slug needs being greater than 200 micrometers, so as to affect the circuit layout of the package carrier. Therefore, how to narrow the gap between the hole and the heat conducting slug and to increase the density of the circuit layout is an urgent issue that needs being solved.

SUMMARY OF THE INVENTION

The invention provides a package carrier having a higher density circuit layout and a better structural reliability.

The invention also provides a manufacturing method of the package carrier, which is adapted to manufacture the above-mentioned package carrier.

The invention provides the manufacturing method of the package carrier, which includes following steps. A substrate having a through hole is provided, wherein a profile of the through hole from top view is a first rounded rectangular. A heat conducting slug is disposed inside the through hole of the substrate, wherein the heat conducting slug and an inner wall of the through hole are separated with a gap, and a profile of the heat conducting slug from top view is a second rounded rectangular. The through hole of the substrate is filled with an insulating material so as to fix the heat conducting slug in the through hole via the insulating material. A conductive through hole structure, a first patterned circuit layer and a second patterned circuit layer are formed. The first patterned circuit layer and the second patterned circuit layer are respectively formed on two opposite sides of the substrate and expose a portion of the substrate. The conductive through hole structure penetrates the substrate and connects a portion of the first patterned circuit layer and a portion of the second patterned circuit layer.

In one embodiment of the invention, a radius of a curvature of the first rounded rectangular is greater than or equal to 1 times of the gap.

In one embodiment of the invention, the heat conducting slug is formed by a punch-pressing process, and a radius of a curvature of a rounded corner of the second rounded rectangular is from 50 micrometers to 500 micrometers.

In one embodiment of the invention, the radius of the curvature of the first rounded rectangular is from 100 micrometers to 500 micrometers.

In one embodiment of the invention, the manufacturing method of the package carrier further comprises: a grinding process is performed to remove a portion of the substrate, a portion of the insulating material, and a portion of the heat conducting slug after filling the through hole of the substrate with the insulating material and before forming the conductive through hole structure, the first patterned circuit layer, and the second patterned circuit layer, so that a top surface and a bottom surface opposite to each other of the heat conducting slug are substantially coplanar with a first surface and a second surface opposite to each other of the insulating material respectively, and substantially coplanar with an upper surface and a lower surface opposite to each other of the substrate respectively.

In one embodiment of the invention, the steps forming the conductive through hole structure, the first patterned circuit layer, and the second patterned circuit layer comprise: a first metal layer and a second metal layer are formed, wherein the first metal layer covers the upper surface of the substrate, the first surface of the insulating material, and the top surface of the heat conducting slug, and the second metal layer covers the lower surface of the substrate, the second surface of the insulating material, and the bottom surface of the heat conducting slug. A passing hole is formed, which penetrates through the first metal layer, the substrate, and the second metal layer. Forming a seed layer on the first metal layer, an inner wall of the passing hole, and the second metal layer. The passing hole is filled with a filling material to form the conductive through hole structure, wherein the seed layer is located between the filling material and the inner wall of the passing hole, and a third surface and a fourth surface opposite to each other of the filling material are substantially coplanar with a fifth surface and a sixth surface opposite to each other of the seed layer respectively. A third metal layer and a fourth metal layer are formed, wherein the third metal layer covers the fifth surface of the seed layer and the third surface of the filling material, and the fourth metal layer covers the sixth surface of the seed layer and the fourth surface of the filling material. A patterning process is performed to pattern the third metal layer, the seed layer, and the first metal layer so as to form the first patterned circuit layer, and to pattern the fourth metal layer, the seed layer, and the second metal layer so as to form the second patterned circuit layer.

In one embodiment of the invention, the manufacturing method of the package carrier further comprises: a first solder mask layer and a second solder mask layer are formed after forming the conductive through hole structure, the first patterned circuit layer, and the second patterned circuit layer. The first solder mask layer is disposed on the first patterned circuit layer and exposes a portion of the first patterned circuit layer, and the second solder mask layer is disposed on the second patterned circuit layer and exposes a portion of the second patterned circuit layer. A first surface treatment layer and a second surface treatment layer are formed. The first surface treatment layer is disposed on the first patterned circuit layer exposed by the first solder mask layer, and the second surface treatment layer is disposed on the second patterned circuit layer exposed by the second solder mask layer.

The package carrier of the invention includes a substrate, a heat conducting slug, an insulating material, a first patterned circuit layer, a second patterned circuit layer, and a conductive through hole structure. The substrate has a through hole, wherein a profile of the through hole from top view is a first rounded rectangular. The heat conducting slug is disposed inside the through hole of the substrate, wherein the heat conducting slug and an inner wall of the through hole are separated with a gap, and a profile of the heat conducting slug from top view is a second rounded rectangular. The insulating material is disposed inside the through hole of the substrate so as to fix the heat conducting slug in the through hole via the insulating material. The first patterned circuit layer is disposed on one side of the substrate. The second patterned circuit layer is disposed on another side of the substrate. The conductive through hole structure penetrates the substrate and connects a portion of the first patterned circuit layer and a portion of the second patterned circuit layer.

In one embodiment of the invention, a radius of a curvature of the first rounded rectangular is greater than or equal to 1 times of the gap.

In one embodiment of the invention, the heat conducting slug is formed by a punch-pressing process, and a radius of a curvature of a rounded corner of the second rounded rectangular is from 50 micrometers to 500 micrometers.

In one embodiment of the invention, the radius of the curvature of the first rounded rectangular is from 100 micrometers to 500 micrometers.

In one embodiment of the invention, a top surface and a bottom surface opposite to each other of the heat conducting slug are substantially coplanar with a first surface and a second surface opposite to each other of the insulating material respectively, and substantially coplanar with an upper surface and a lower surface opposite to each other of the substrate respectively.

In an embodiment of the invention, the package carrier further includes a first solder mask layer and a second solder mask layer. The first solder mask layer is disposed on the first patterned circuit layer and exposes a portion of the first patterned circuit layer. The second solder mask layer is disposed on the second patterned circuit layer and exposes a portion of the second patterned circuit layer.

In an embodiment of the invention, the package carrier further includes a first surface treatment layer and a second surface treatment layer. The first surface treatment layer is disposed on the first patterned circuit layer exposed by the first solder mask layer. The second surface treatment layer is disposed on the second patterned circuit layer exposed by the second solder mask layer.

Based on the above, the profile of the heat conducting slug of the invention from top view is the rounded rectangular, so as to prevent the problem that stress concentration is generated at the corners of the heat conducting slug, and to improve the structural reliability of the package carrier. In addition, the profiles of the heat conducting slug and the through hole of the substrate from top view are the same (the rounded rectangular), and therefore the heat conducting slug does not generate structural interference when positioning inside the through hole of the substrate, so that the heat conducting slug can be accurately positioned inside the through hole to improve the structural reliability of the package carrier.

In order to make the aforementioned and other features and advantages of the invention more comprehensible, embodiments accompanying figures are described in detail belows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF THE EMBODIMENTS

Figure 1A:
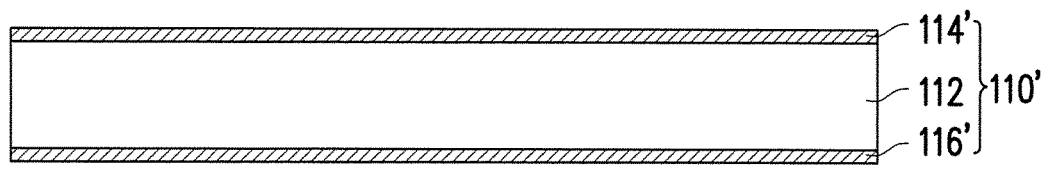
FIG. 1A to FIG. 1M are cross-sectional schematic views depicting a manufacturing method of a package carrier of one embodiment of the invention.
Figure 1B:
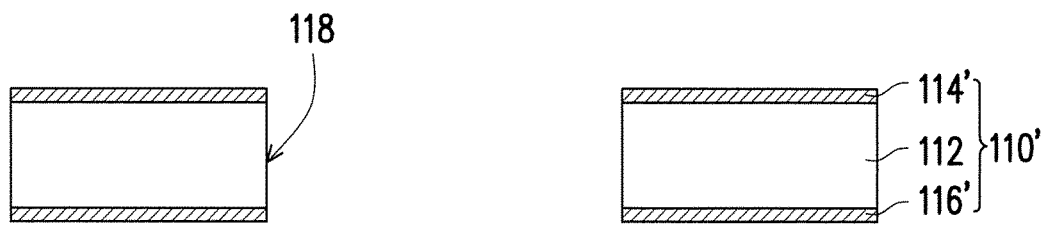
Figure 1C:
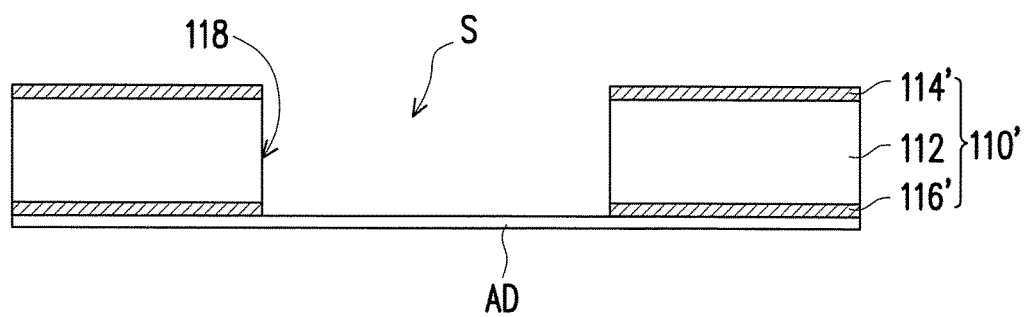
Figure 1D:
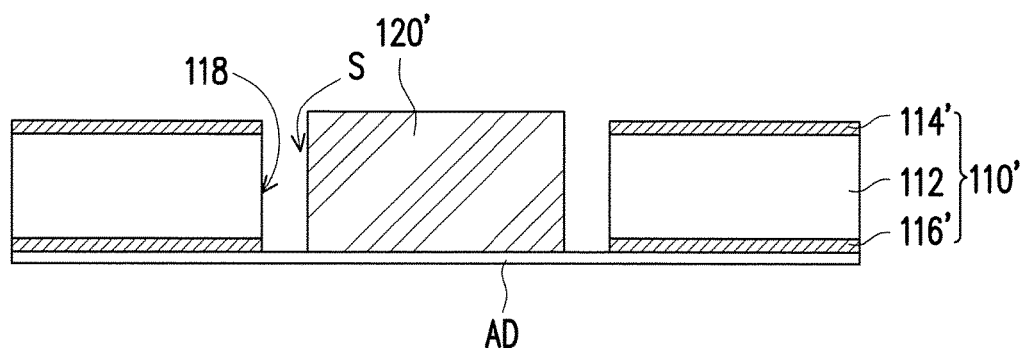
Figure 1E:
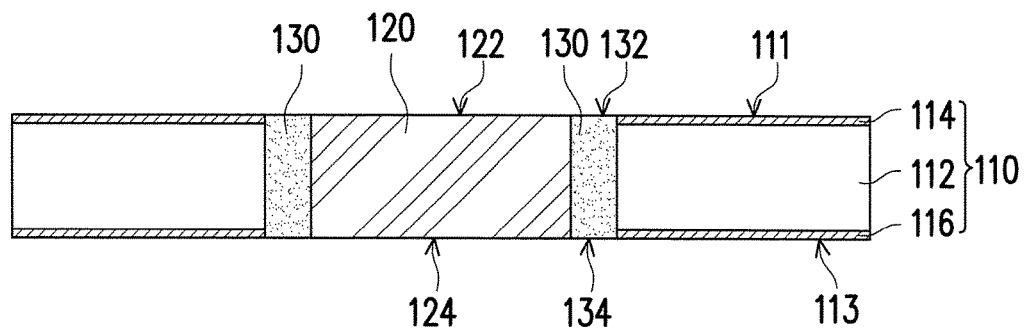
Figure 1F:
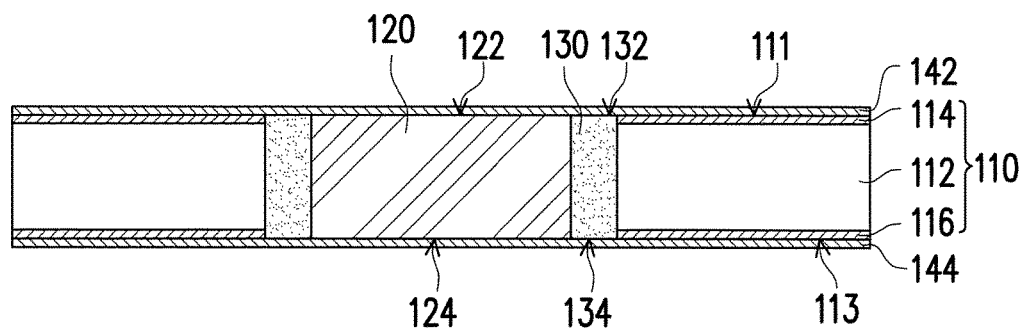
Figure 1G:
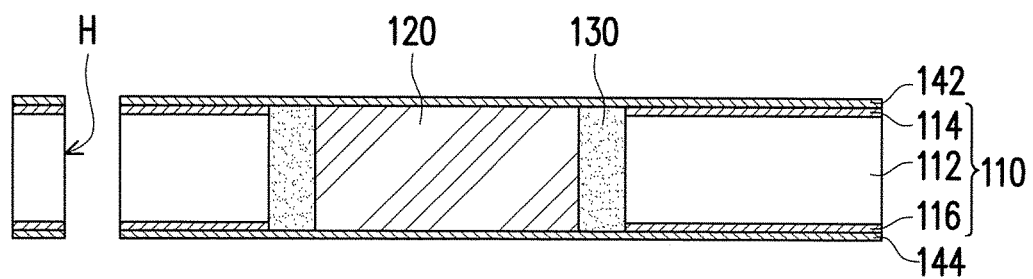
Figure 1H:
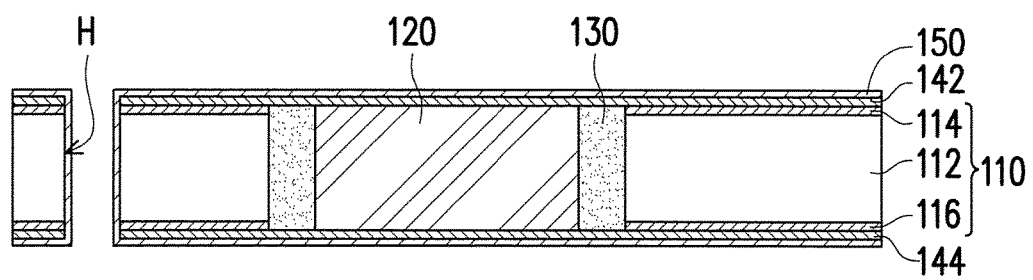
Figure 1I:
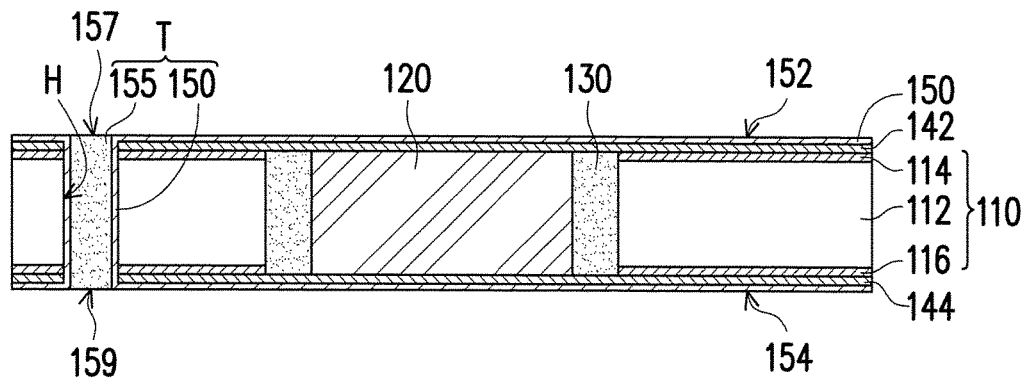
Figure 1J:
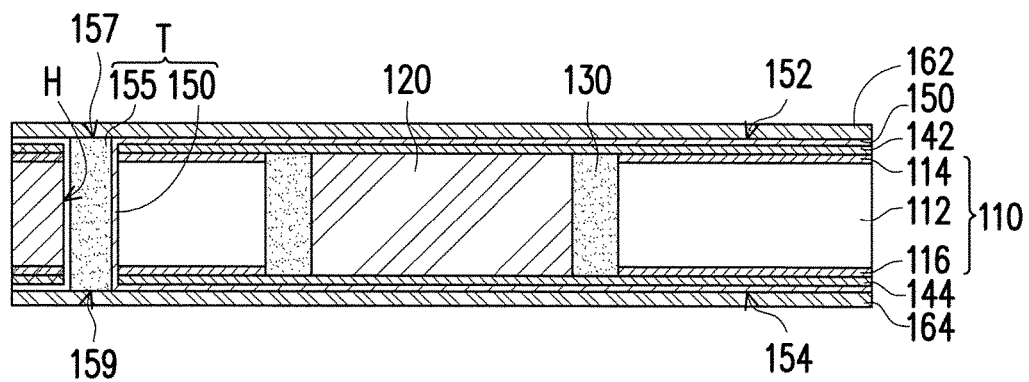
Figure 1K:
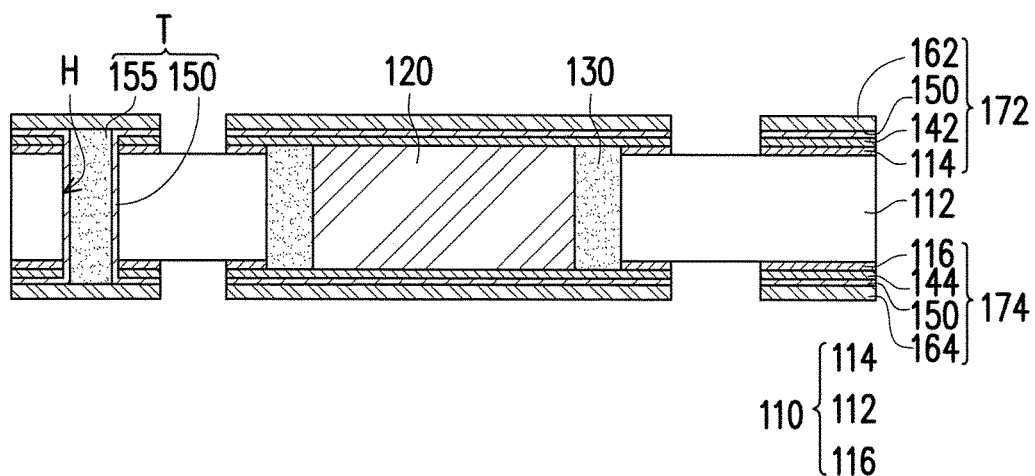
Figure 2:
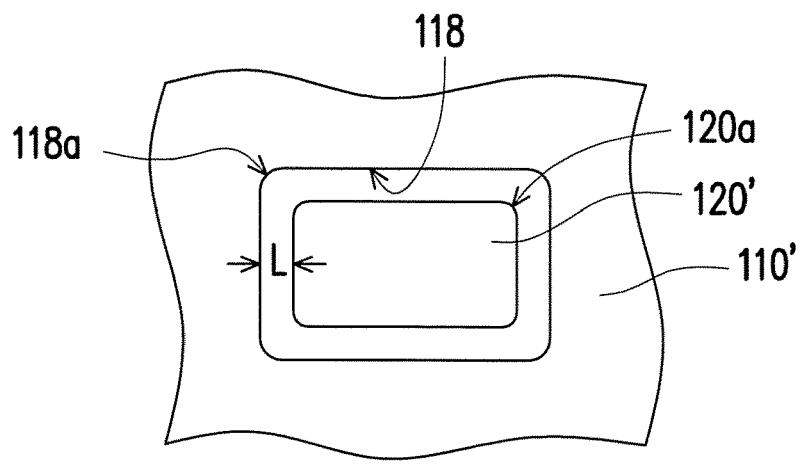
FIG. 2 is a partial schematic top view depicting a heat conducting element disposed inside a through hole of a substrate corresponding to FIG. 1D.
Figure 3:
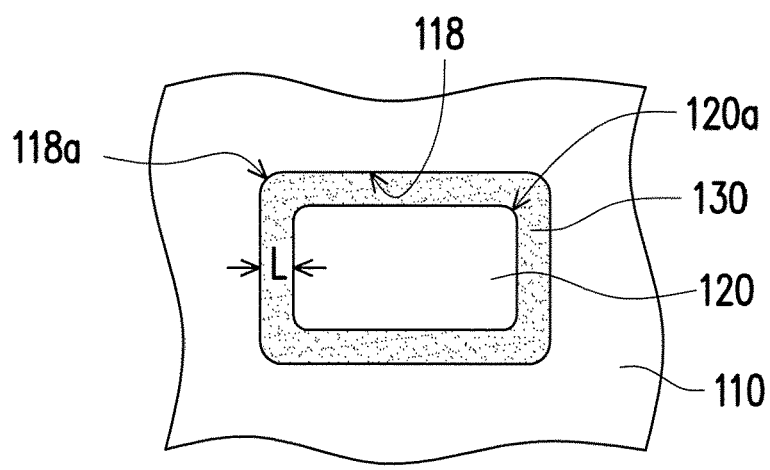
FIG. 3 is a partial schematic top view depicting an insulating material disposed inside a through hole of a substrate corresponding to FIG. 1E.

FIG. 1A to FIG. 1M are cross-sectional schematic views depicting a manufacturing method of a package carrier of one embodiment of the invention. FIG. 2 is a partial schematic top view depicting a heat conducting element disposed inside a through hole of a substrate corresponding to FIG. 1D. FIG. 3 is a partial schematic top view depicting an insulating material disposed inside a through hole of a substrate corresponding to FIG. 1E. According to the manufacturing method of the package carrier, firstly, referring to FIG. 1A, providing a substrate 110'. The substrate 110' of the present embodiment can be, for example, a single layer circuit board, a double layer circuit board, or a multi-layer circuit board. Herein, as shown in FIG. 1A, the substrate 110' is a double layer circuit board which is constructed by a dielectric layer 112 and circuit layers 114', 116' located at two opposite sides of the dielectric layer 112, but the invention is not limited thereto.

Subsequently, referring to the FIG. 1B and FIG. 2 simultaneously, forming a through hole 118 which penetrates through the dielectric layer 112 and the circuit layers 114', 116' of the substrate 110', wherein a profile of the through hole 118 from top view is a first rounded rectangular 118a. Herein, the method for forming the through hole 118 is, for example, punching, routing, mechanical drilling, laser drilling, or other appropriate methods, which are not limited by the invention. The radius of the curvature of the first rounded rectangular 118a is, for example, greater than or equal to 1 times of the gap L, or the radius of the curvature can be, for example, from 1.5 times to 15 times of the gap L, but the invention is not limited thereto. Preferably, the radius of the curvature of the first rounded rectangular 118a is from 100 micrometers to 500 micrometers. The gap L is, for example, from 50 micrometers to 500 micrometers. The above-mentioned scope is used for description and the invention is not limited thereto.

Subsequently, referring to FIG. 1C, an adhesive layer AD is disposed on one side of the substrate 110', wherein the adhesive layer AD and the through hole 118 of the substrate 110' define an accommodating space S. It should be noted here, the adhesive layer AD is only adhered to one side of the substrate 110' temporarily to serve as a supporting element for a subsequent heat conducting element 120'.

Subsequently, referring to FIG. 1D and FIG. 2, disposing a heat conducting slug 120' inside the through hole 118 of the substrate 110' and in the accommodating space S, wherein a gap L is in between the heat conducting slug 120' and the inner wall of the through hole 118, and a profile of the heat conducting slug 120' from top view is a second rounded rectangular 120a. The heat conducting slug 120' of the present embodiment is formed by a punch-pressing process, and therefore the peripheral corners of the heat conducting slug 120' are all rounded corners, so as to prevent the conventional problem that stress concentration is generated at the right angle corners of the heat conducting slug. After that, the heat conducting slug 120' in the present embodiment is formed by the punch-pressing process, therefore, the production is at a fast rate and the process stability is high, so as to prevent the product quality from being varied, and to improve the product yield. Preferably, the radius of the curvature of the rounded corner of the second rounded rectangular 120a is from 50 micrometers to 500 micrometers, herein, the material of the heat conducting slug 120' is, for example, metal such as copper, copper alloys, aluminum, aluminum alloys, titanium, titanium alloys, etc., but it is not limited thereto.

Subsequently, filling the through hole 118 of the substrate 110' with an insulating material (not shown) so as to fix the heat conducting slug 120' in the through hole 118 of the substrate 110' via the insulating material. At this time, the heights of the thickness of the insulating material and the thickness of the heat conducting slug 120' are all higher than the surface of the circuit layer 114', and the accommodating space S is filled up with the insulating material and the heat conducting slug 120'. Herein, the method for filling the through hole 118 of the substrate 110' with the insulating material is, for example, vacuum screen printing, but not be limited thereto. In addition, the material of the insulating material is, for example, resin or glue, but not be limited thereto. Subsequently, removing the adhesive layer AD (referring to FIG. 1D), so as to expose the heat conducting slug 120' and the circuit layer 116'. Herein, the method for removing the adhesive layer AD is a mechanical stripping method.

Subsequently, Referring to the FIG. 1E, FIG. 1F, and FIG. 3 simultaneously, in order to have a better surface flatness, a grinding process is performed to remove a portion of the substrate 110', a portion of the insulating material, and a portion of the heat conducting slug 120', so as to form the insulating material 130, the heat conducting slug 120, and the substrate 110 having the circuit layers 114, 116, and the dielectric layer 112. At this time, a top surface 122 and a bottom surface 124 opposite to each other of the heat conducting slug 120 are substantially coplanar with a first surface 132 and a second surface 134 opposite to each other of the insulating material 130 respectively, and substantially coplanar with an upper surface 111 and a lower surface 113 opposite to each other of the substrate 110 respectively.

Subsequently, referring to FIG. 1F, forming a first metal layer 142 and a second metal layer 144, wherein the first metal layer 142 covers the upper surface 111 of the substrate 110, the first surface 132 of the insulating material 130, and the top surface 122 of the heat conducting slug 120, and the second metal layer 144 covers the lower surface 113 of the substrate 110, the second surface 134 of the insulating material 130, and the bottom surface 124 of the heat conducting slug 120. Herein, the material of the first metal layer 142 and the second metal layer 144 is, for example, copper, copper alloys, aluminum, aluminum alloys, titanium, titanium alloys, etc., but it is not limited thereto.

Subsequently, referring to FIG. 1G, forming a passing hole H, wherein the passing hole H penetrates through the first metal layer 142, the substrate 110, and the second metal layer 144. Herein, the method for forming the passing hole H is, for example, punching, routing, mechanical drilling, laser drilling, or other appropriate methods, which are not limited by the invention.

Subsequently, referring to FIG. 1H, forming a seed layer 150 on the first metal layer 142, an inner wall of the passing hole H, and the second metal layer 144. Herein, the material of the seed layer 150 is, for example, copper, or conductive materials such as conducting polymer, which are not limited by the invention.

Subsequently, referring to FIG. 1I, filling the passing hole H with a filling material 155 to form a conductive through hole structure T. At this time, the seed layer 150 is located between the filling material 155 and the inner wall of the through hole 118, and a third surface 157 and a fourth surface 159 opposite to each other of the filling material 155 are substantially coplanar with a fifth surface 152 and a sixth surface 154 opposite to each other of the seed layer 150 respectively. In addition, the conductive through hole structure T is constructed by the seed layer 150 and the filling material 155. Herein, the material of the filling material 155 is, for example, resin or glue.

Subsequently, referring to FIG. 1J, forming a third metal layer 162 and a fourth metal layer 164, wherein the third metal layer 162 covers the fifth surface 152 of the seed layer 150 and the third surface 157 of the filling material 155, and the fourth metal layer 164 covers the sixth surface 154 of the seed layer 150 and the fourth surface 159 of the filling material 155. Herein, the material of the third metal layer 162 and the fourth metal layer 164 is, for example, copper, etc.

Subsequently, referring to FIG. 1K, performing a patterning process to pattern the third metal layer 162, the seed layer 150, the first metal layer 142 and a portion of the substrate 110 (the circuit layer 114) so as to form the first patterned circuit layer 172, and to pattern the fourth metal layer 164, the seed layer 150, the second metal layer 144, and a portion of the substrate 110 (the circuit layer 116) so as to form the second patterned circuit layer 174. At this time, as shown in FIG. 1K, the first patterned circuit layer 172 and the second patterned circuit layer 174 are respectively formed on two opposite sides of the substrate 110 and expose a portion of the substrate 110, and the conductive through hole structure T penetrates the substrate 110 and connects a portion of the first patterned circuit layer 172 and a portion of the second patterned circuit layer 174.

Figure 1L:
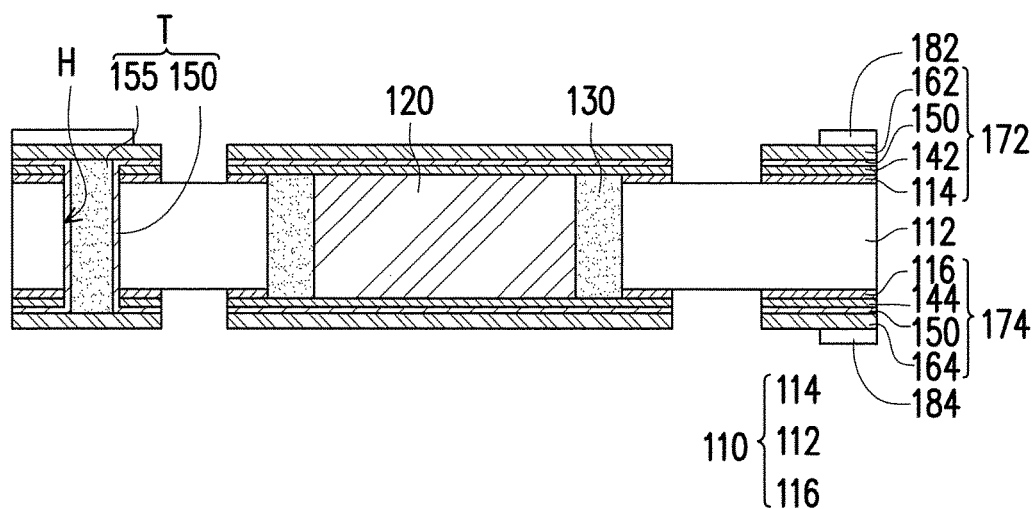

After that, referring to FIG. 1L, optionally forming a first solder mask layer 182 and a second solder mask layer 184, wherein the first solder mask layer 182 is disposed on the first patterned circuit layer 172 and exposes a portion of the first patterned circuit layer 172, and the second solder mask layer 184 is disposed on the second patterned circuit layer 174 and exposes a portion of the second patterned circuit layer 174.

Figure 1M:
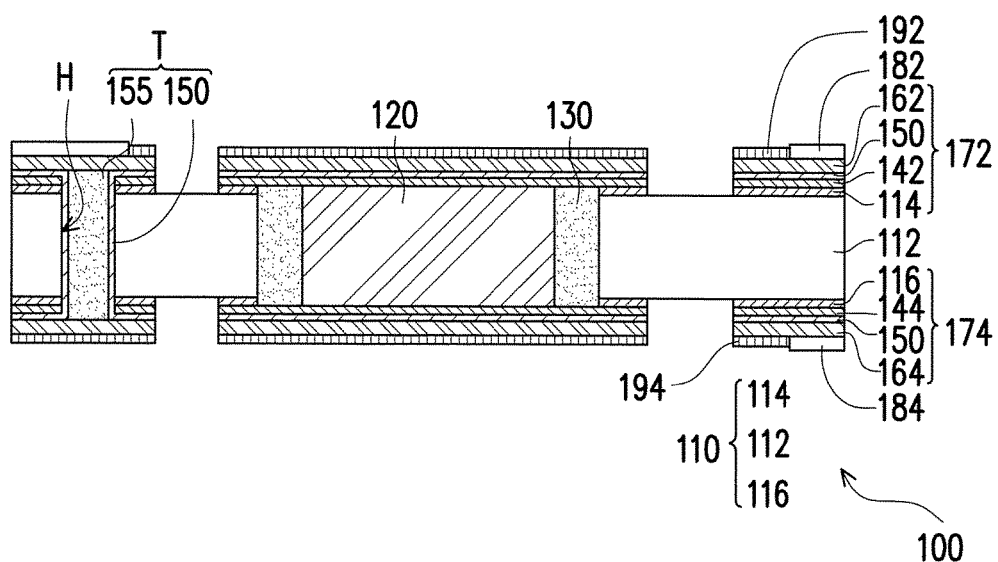

After that, referring to FIG. 1M, in order to maintain the structural properties of the exposed first patterned circuit layer 172 and the exposed second patterned circuit layer 174, forming a first surface treatment layer 192 and a second surface treatment layer 194, wherein the first surface treatment layer 192 is disposed on the first patterned circuit layer 172 exposed by the first solder mask layer 182, and the second surface treatment layer 194 is disposed on the second patterned circuit layer 174 exposed by the second solder mask layer 184. The material of the first surface treatment layer 192 and the second surface treatment layer 194 in the present embodiment is, for example, nickel, palladium, gold, or alloys of the said materials, so as to prevent the first patterned circuit layer 172 and the second patterned circuit layer 174 from being oxidized or being subject to the external contamination. So far, the package carrier 100 is completely manufactured.

In above structure, referring to FIG. 1M, the package carrier 100 of the present embodiment includes the substrate 110, the heat conducting slug 120, the insulating material 130, the first patterned circuit layer 172, the second patterned circuit layer 174, and the conductive through hole structure T. The substrate 110 has a through hole 118, wherein a profile of the through hole 118 from top view is a first rounded rectangular 118a (as shown in FIG. 2), preferably, the radius of the curvature of the rounded corner of the first rounded rectangular 118a is from 100 micrometers to 500 micrometers. The heat conducting slug 120 is disposed inside the through hole 118 of the substrate 110, wherein the heat conducting slug 120 and the inner wall of the through hole 118 are separated with a gap L (referring to FIG. 2), and the profile of the heat conducting slug 120 from top view is a second rounded rectangular 120a. In one embodiment of the invention, the radius of the curvature of the first rounded rectangular 118 is greater than or equal to 1 times of the gap L. Preferably, the heat conducting slug 120 is formed by a punch-pressing process, and the radius of the curvature of the second rounded rectangular 120a is from 50 micrometers to 500 micrometers. The insulating material 130 is disposed inside the through hole 118 of the substrate 110 so as to fix the heat conducting slug 120 in the through hole 118 via the insulating material 130. At this time, the top surface 122 and the bottom surface 124 opposite to each other of the heat conducting slug 120 are substantially coplanar with the first surface 132 and the second surface 134 opposite to each other of the insulating material 130 respectively, and substantially coplanar with the upper surface 111 and the lower surface 113 opposite to each other of the substrate 110 respectively. The first patterned circuit layer 172 is disposed on one side of the substrate 110, and the second patterned circuit layer 174 is disposed on another side of the substrate 110. The conductive through hole structure T penetrates the substrate 110 and connects a portion of the first patterned circuit layer 172 and a portion of the second patterned circuit layer 174.

In addition, the package carrier 100 in the present embodiment can optionally include the first solder mask layer 182, the second solder mask layer 184, the first surface treatment layer 192, and the second surface treatment layer 194. The first solder mask layer 182 is disposed on the first patterned circuit layer 172 and exposes a portion of the first patterned circuit layer 172, and the second solder mask layer 184 is disposed on the second patterned circuit layer 174 and exposes a portion of the second patterned circuit layer 174. The first surface treatment layer 192 is disposed on the first patterned circuit layer 172 exposed by the first solder mask layer 182, and the second surface treatment layer 194 is disposed on the second patterned circuit layer 174 exposed by the second solder mask layer 184.

Figure 4:
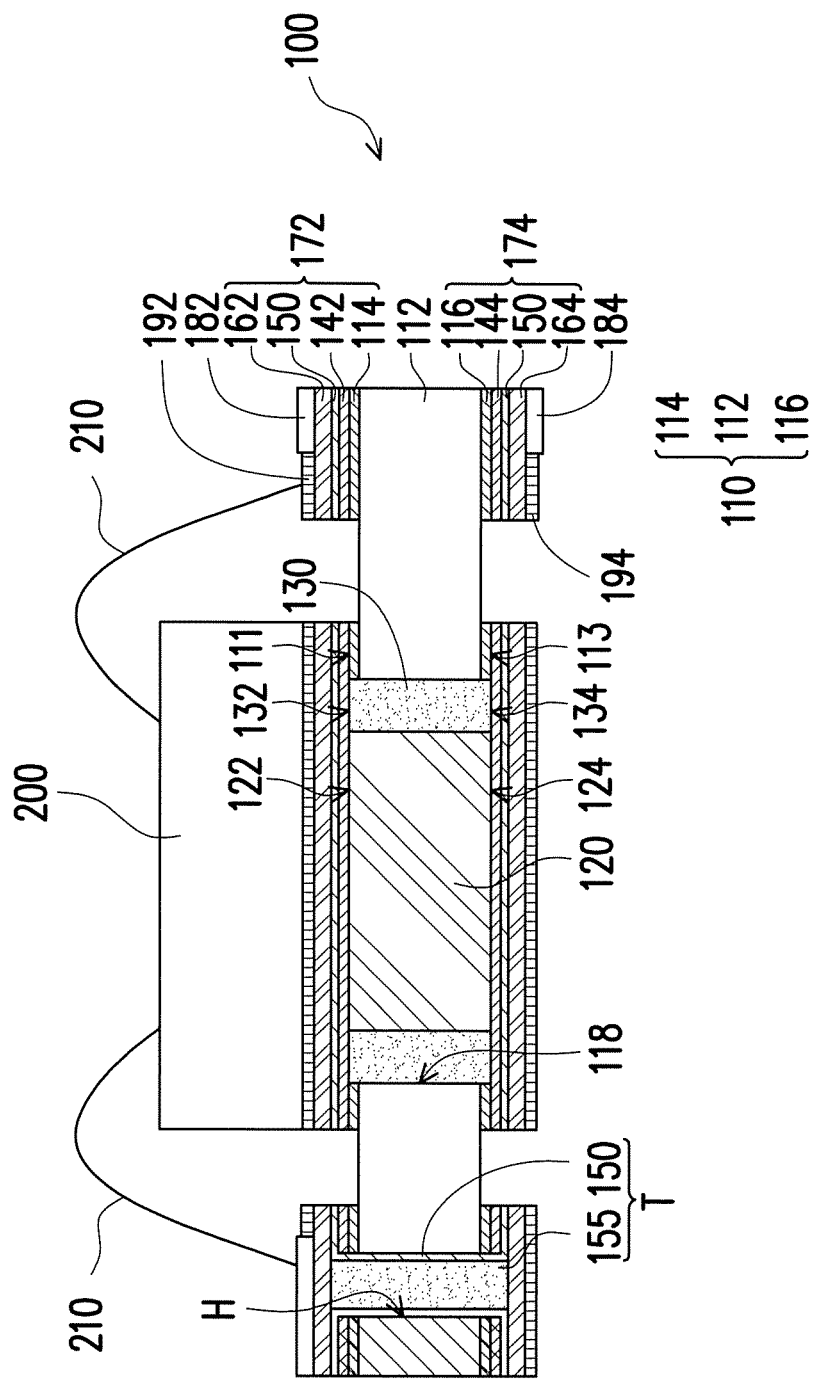
FIG. 4 is a cross-sectional schematic view depicting the package carrier carrying a heat generating element corresponding to FIG. 1M.

The profile of the heat conducting slug 120 of the present embodiment from top view is the rounded rectangular, so as to prevent the problem that stress concentration is generated at the corners of the heat conducting slug 120, and to improve the structural reliability of the package carrier 100. Furthermore, the profiles of the heat conducting slug 120 and the through hole 118 of the substrate 110 from top view are the same (the rounded rectangular), and therefore the heat conducting slug 120 does not generate structural interference when positioning inside the through hole 118 of the substrate 110, so that the heat conducting slug can be accurately positioned inside the through hole, so as to improve the structural reliability of the package carrier 100. Otherwise, in the subsequent application, referring to FIG. 4, a heat generating element 200 can be disposed on the package carrier 100 and correspondingly configured above the heat conducting slug 120, and the heat generating element 200 is electrically connected to the package carrier 100 by using a joining or a wire bonding method, such as bonding a plurality of wires 210. As a result, the heat generated by the heat generating element 200 transfers rapidly and directly from the first surface treatment layer 192, the first patterned circuit layer 172, the heat conducting slug 120, the second patterned circuit layer 174, and the second surface treatment layer 194 to the external environment, so that the package carrier 100 in the present embodiment can have a better heat conducting effect.

In summary, the profile of the heat conducting slug of the invention from top view is the rounded rectangular, so as to prevent the problem that stress concentration is generated at the corners of the heat conducting slug, and to improve the structural reliability of the package carrier. In addition, the profiles of the heat conducting slug and the through hole of the substrate from top view are the same (the rounded rectangular), and therefore the structural interference that the heat conducting slug cannot be positioned inside the through hole is not generated when the heat conducting slug is positioned inside the through hole of the substrate, so that the heat conducting slug can be accurately positioned inside the through hole to improve the structural reliability and the product yield of the package carrier.

Although the present invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a package carrier, comprising:
   providing a substrate having a through hole, wherein a profile of the through hole from top view is a first rounded rectangular;
   disposing a heat conducting slug inside the through hole of the substrate, wherein the heat conducting slug and an inner wall of the through hole are separated with a gap, and a profile of the heat conducting slug from top view is a second rounded rectangular;

filling the through hole of the substrate with an insulating material so as to fix the heat conducting slug in the through hole via the insulating material;

forming a conductive through hole structure, a first patterned circuit layer and a second patterned circuit layer, wherein the first patterned circuit layer and the second patterned circuit layer are respectively formed on two opposite sides of the substrate and expose a portion of the substrate, the conductive through hole structure penetrates the substrate and connects a portion of the first patterned circuit layer and a portion of the second patterned circuit layer, and performing a grinding process to remove a portion of the substrate, a portion of the insulating material, and a portion of the heat conducting slug after filling the through hole of the substrate with the insulating material and before forming the conductive through hole structure, the first patterned circuit layer, and the second patterned circuit layer, so that a top surface and a bottom surface opposite to each other of the heat conducting slug are substantially coplanar with a first surface and a second surface opposite to each other of the insulating material respectively, and substantially coplanar with an upper surface and a lower surface opposite to each other of the substrate respectively.

2. The manufacturing method of the package carrier as recited in claim 1, wherein a radius of a curvature of the first rounded rectangular is greater than or equal to 1 times of the gap.

3. The manufacturing method of the package carrier as recited in claim 1, wherein the heat conducting slug is formed by a punch-pressing process, and a radius of a curvature of the second rounded rectangular is from 50 micrometers to 500 micrometers.

4. The manufacturing method of the package carrier as recited in claim 1, wherein a radius of a curvature of the first rounded rectangular is from 100 micrometers to 500 micrometers.

5. The manufacturing method of the package carrier as recited in claim 1, further comprising:

forming a first solder mask layer and a second solder mask layer after forming the conductive through hole structure, the first patterned circuit layer, and the second patterned circuit layer, wherein the first solder mask layer is disposed on the first patterned circuit layer and exposes a portion of the first patterned circuit layer, and the second solder mask layer is disposed on the second patterned circuit layer and exposes a portion of the second patterned circuit layer; and forming a first surface treatment layer and a second surface treatment layer, wherein the first surface treatment layer is disposed on the first patterned circuit layer exposed by the first solder mask layer, and the second surface treatment layer is disposed on the second patterned circuit layer exposed by the second solder mask layer.

6. The manufacturing method of the package carrier as recited in claim 1, wherein steps forming the conductive through hole structure, the first patterned circuit layer and the second patterned circuit layer comprise:

forming a first metal layer and a second metal layer, wherein the first metal layer covers the upper surface of the substrate, the first surface of the insulating material, and the top surface of the heat conducting slug, and the second metal layer covers the lower surface of the substrate, the second surface of the insulating material, and the bottom surface of the heat conducting slug;

forming a passing hole, penetrating through the first metal layer, the substrate, and the second metal layer;

forming a seed layer on the first metal layer, an inner wall of the passing hole, and the second metal layer;

filling the passing hole with a filling material to form the conductive through hole structure, wherein the seed layer is located between the filling material and the inner wall of the passing hole, and a third surface and a fourth surface opposite to each other of the filling material are substantially coplanar with a fifth surface and a sixth surface opposite to each other of the seed layer respectively;

forming a third metal layer and a fourth metal layer, wherein the third metal layer covers the fifth surface of the seed layer and the third surface of the filling material, and the fourth metal layer covers the sixth surface of the seed layer and the fourth surface of the filling material; and performing a patterning process to pattern the third metal layer, the seed layer, and the first metal layer so as to form the first patterned circuit layer, and to pattern the fourth metal layer, the seed layer, and the second metal layer so as to form the second patterned circuit layer.

* * * * *